(12) United States Patent
Harris

(10) Patent No.: US 8,796,809 B2
(45) Date of Patent: Aug. 5, 2014

(54) VARACTOR DIODE WITH DOPED VOLTAGE BLOCKING LAYER

(75) Inventor: Christopher Harris, Täby (SE)

(73) Assignee: Cree, Inc., Durham, NC (US)

( * ) Notice: Subject to any disclaimer, the term of this patent is extended or adjusted under 35 U.S.C. 154(b) by 1046 days.

(21) Appl. No.: 12/206,209

(22) Filed: Sep. 8, 2008

(65) Prior Publication Data

US 2010/0059850 A1   Mar. 11, 2010

(51) Int. Cl.
| | | |
|---|---|---|
| *H01L 29/93* | (2006.01) | |
| *H01L 21/329* | (2006.01) | |
| *H01L 27/08* | (2006.01) | |
| *H01L 29/66* | (2006.01) | |
| *H01L 29/36* | (2006.01) | |
| H01L 29/47 | (2006.01) | |
| H01L 29/40 | (2006.01) | |
| H01L 29/16 | (2006.01) | |
| H01L 29/20 | (2006.01) | |
| H01L 29/267 | (2006.01) | |

(52) U.S. Cl.
CPC ............ *H01L 29/93* (2013.01); *H04L 27/0811* (2013.01); *H01L 29/47* (2013.01); *H01L 29/402* (2013.01); *H01L 29/1608* (2013.01); *H01L 27/0808* (2013.01); *H01L 29/1602* (2013.01); *H01L 29/66174* (2013.01); *H01L 29/2003* (2013.01); *H01L 29/267* (2013.01); *H01L 29/36* (2013.01)
USPC .................... 257/480; 257/595; 257/E29.344; 257/E27.049; 257/E21.364; 438/379

(58) Field of Classification Search
CPC . H01L 27/0808; H01L 27/0811; H01L 29/93; H01L 29/36; H01L 29/66174; H01L 29/1602; H01L 29/1608; H01L 29/2003; H01L 29/402; H01L 29/47; H01L 29/267

USPC .................. 257/480, 595, E29.344, E21.364, 257/E27.049; 438/379
See application file for complete search history.

(56) References Cited

U.S. PATENT DOCUMENTS

| | | | |
|---|---|---|---|
| 3,149,395 A | 9/1964 | Bray et al. | |
| 3,581,164 A * | 5/1971 | Pfander et al. | ................. 257/535 |

(Continued)

FOREIGN PATENT DOCUMENTS

| | | |
|---|---|---|
| JP | 1053582 A | 3/1989 |
| JP | 7147420 A | 6/1995 |

(Continued)

OTHER PUBLICATIONS

Merriam Webster OnLine definition of "discrete." No Date.*

(Continued)

*Primary Examiner* — Hrayr A Sayadian
(74) *Attorney, Agent, or Firm* — Myers Bigel Sibley & Sajovec, P.A.

(57) ABSTRACT

A varactor diode includes a contact layer having a first conductivity type, a voltage blocking layer having the first conductivity and a first net doping concentration on the contact layer, a blocking junction on the voltage blocking layer, and a plurality of discrete doped regions in the voltage blocking layer and spaced apart from the carrier injection junction. The plurality of discrete doped regions have the first conductivity type and a second net doping concentration that is higher than the first net doping concentration, and the plurality of discrete doped regions are configured to modulate the capacitance of the varactor diode as a depletion region of the varactor diode expands in response to a reverse bias voltage applied to the blocking junction. Related methods of forming a varactor diode are also disclosed.

15 Claims, 4 Drawing Sheets

(56) References Cited

U.S. PATENT DOCUMENTS

| | | | |
|---|---|---|---|
| 3,634,798 A | | 1/1972 | Astleford, Jr. et al. |
| 4,876,211 A | | 10/1989 | Kanber et al. |
| 4,954,850 A | * | 9/1990 | Kasahara ............... 257/597 |
| 5,225,708 A | | 7/1993 | Kasahara |
| 5,506,442 A | * | 4/1996 | Takemura .............. 257/597 |
| 5,851,908 A | * | 12/1998 | Harris et al. ........... 438/520 |
| 6,107,142 A | | 8/2000 | Suvorov et al. |
| 6,215,456 B1 | * | 4/2001 | Nakanishi .............. 343/895 |
| 7,102,429 B2 | | 9/2006 | Stengel et al. |
| 2003/0107041 A1 | * | 6/2003 | Tanimoto et al. ........ 257/77 |
| 2007/0215978 A1 | * | 9/2007 | Stricker et al. .......... 257/565 |
| 2007/0292999 A1 | | 12/2007 | Henning et al. |

FOREIGN PATENT DOCUMENTS

| | | |
|---|---|---|
| JP | 102000133 A | 7/1998 |
| JP | 2000 312013 A | 11/2000 |
| JP | 2000312013 A | 11/2000 |
| JP | 2007534713 A | 11/2007 |
| JP | 2008516441 A | 5/2008 |
| JP | 2008527714 A | 7/2008 |
| WO | WO 2005/114738 A | 12/2005 |
| WO | WO 2007/061308 | 5/2007 |

OTHER PUBLICATIONS

"Introduction to Electronic Device," by Shur, pp. 214-222 (1996).*
EP Search Report for Application No. 09/169502.3-2203, mailed Dec. 30, 2009.
Meyer, Robert G. et al., "Distortion in Variable-Capacitance Diodes", *IEEE Journal of Solid-State Circuits*, vol. SC-10, No. 1, Feb. 1975, pp. 47-54.

* cited by examiner

VARACTOR DIODE WITH DOPED VOLTAGE BLOCKING LAYER

FIELD OF THE INVENTION

The present invention relates to electronic devices, and in particular to varactor diodes for use in load modulation schemes for improved amplifier efficiency.

BACKGROUND

High frequency amplifiers operate most efficiently when the output of the amplifier is delivered to an impedance matched load, that is, a load that has an input impedance equal to the output impedance of the amplifier. However, the output impedance of a high frequency amplifier is a function of both the frequency of operation of the amplifier as well as the power output by the amplifier. Thus, to obtain high efficiency at a given operating frequency, it is desirable to adapt the impedance of the load based on the power output by the amplifier. For example, some digital modulation techniques have a high peak-to-average power ratio. A designer of an RF power module may choose to optimize the amplifier chain for efficiency at the peak output power. However, in that case, the efficiency of the amplifier at the average power level may suffer.

Varactor diodes, also referred to as varicap diodes, variable capacitance diodes, and tuning diodes, can be used as variable reactance elements in an impedance matching transformer for a high frequency amplifier. The capacitance of a varactor diode can be controlled by adjusting the reverse bias level of the diode. Because varactor diodes are operated in reverse bias, only limited current flows through the diode during such operation. However, since the thickness of the depletion region in a reverse biased diode varies with the applied bias voltage, the capacitance of the diode can be controlled. In a conventional diode structure, the depletion region thickness is proportional to the square root of the applied voltage, and the capacitance of the diode is inversely proportional to the depletion region thickness. Thus, the capacitance of a conventional diode is inversely proportional to the square root of applied voltage.

The performance of a varactor is also characterized by its so called Q factor, defined as the ratio between the capacitive reactance to the equivalent series resistance (ESR). To achieve high Q (i.e., low loss performance), the material used to form the varactor should be able to support a high control voltage while maintaining low resistance. The wide bandgap materials including, but not limited to SiC or GaN, have an inherently high electric field strength, allowing a thin highly doped layer to have a large breakdown voltage. Accordingly, such materials should allow a very high Q value to be achieved with low insertion loss.

Some attempts have been made to alter the capacitance-voltage relationship of silicon or gallium arsenide-based varactor diodes by providing a graded doping profile in the voltage blocking region of the diode. The graded doping profile has been typically achieved either using epitaxial growth, diffusion or implantation. However, providing a complex graded doping profile can prove difficult in practice, because of the limitations of the processes used in reproducible manufacturing.

SUMMARY

A varactor diode according to some embodiments includes a highly doped contact layer that may include the substrate of the device, a voltage blocking layer having a first conductivity type and a first net doping concentration on the contact layer, a blocking junction on the voltage blocking layer, and a plurality of discrete doped regions in the voltage blocking layer and spaced apart from the carrier injection junction. The discrete doped regions have the first conductivity type and a second net doping concentration that is higher than the first net doping concentration. The discrete doped regions are configured to modulate the capacitance of the varactor diode as the depletion region of the varactor diode expands in response to a reverse bias voltage applied across the blocking junction. By using a number of parallel coupled diodes, each containing discrete, well-defined doping regions, a complex graded doping profile can be approximated.

The plurality of discrete doped regions may include first discrete doped regions spaced a first distance from the blocking junction and second discrete doped regions spaced a second distance from the carrier injection junction, the second distance is greater than the first distance.

The first discrete doped regions may provide a first total charge at the first distance from the blocking junction and the second discrete doped regions may provide a second total charge at the second distance from the blocking junction that is greater than or equal to the first total charge.

The first discrete doped regions may have a first net doping concentration and the second discrete doped regions may have a second net doping concentration that is less than the first net doping concentration.

The plurality of discrete doped regions may further include third discrete doped regions spaced a third distance from the blocking junction that is greater than the second distance, and the third discrete doped regions may have a third net doping concentration that is less than the second net doping concentration.

The plurality of discrete doped regions may further include third discrete doped regions spaced a third distance from the blocking junction that is greater than the second distance.

The first, second and third discrete doped regions may not necessarily overlap in a lateral direction parallel to the carrier injection junction.

The varactor diode may further include a Schottky metal contact on the voltage blocking layer, and the blocking junction may include a Schottky barrier junction.

The varactor diode may further include a second layer having a second conductivity type opposite the first conductivity type on the voltage blocking layer, and the blocking junction is thereby formed by a P-N junction between the second layer and the voltage blocking layer.

The voltage blocking layer may include a wide bandgap semiconductor material such as silicon carbide.

Some embodiments of the invention provide a variable impedance matching circuit for a high frequency amplifier including a varactor diode as described above.

Methods of forming a varactor diode according to some embodiments of the invention include providing a voltage blocking layer having a first conductivity type and a first net doping concentration, and forming a plurality of discrete doped regions in the voltage blocking layer and spaced apart from a blocking junction. A blocking junction is formed on the voltage blocking layer. The discrete doped regions have the first conductivity type and a second net doping concentration that is higher than the first net doping concentration, and the plurality of discrete doped regions are configured to modulate the capacitance of the varactor diode as a depletion region of the varactor diode expands in response to an applied reverse bias voltage.

Forming the plurality of discrete doped regions may include implanting ions into the voltage blocking layer. In particular, forming the plurality of discrete doped regions may include selectively implanting first ions at a first implant energy and first dose to form first discrete doped regions spaced a first distance from the blocking junction and selectively implanting second ions at a second implant energy and second dose to form second discrete doped regions spaced a second distance from the blocking junction that is greater than the first distance.

Selectively implanting first ions and second ions may include selectively implanting the first ions and the second ions so that the first and second discrete doped regions do not overlap in a lateral direction parallel to the carrier injection junction.

The first discrete doped regions may provide a first total charge at the first distance from the blocking junction and the second discrete doped regions may provide a second total charge at the second distance from the blocking junction that is greater than or equal to the first total charge.

The first discrete doped regions may have a first net doping concentration and the second discrete doped regions may have a second net doping concentration that is less than the first net doping concentration.

Implanting ions into the voltage blocking layer may include forming a multi-level implant mask on the voltage blocking layer and implanting ions into the voltage blocking layer through the multi-layered implant mask so that ions implanted through the multi-level implant mask are positioned at different depths in the voltage blocking layer corresponding to different thicknesses of the multi-level implant mask.

A varactor diode structure according to some embodiments includes a common contact layer having a first conductivity type, a first voltage blocking layer having the first conductivity type and a first net doping concentration on the common contact layer, a first blocking junction on the first voltage blocking layer, and a first plurality of discrete doped regions in the first voltage blocking layer and spaced apart from the first blocking junction. The first plurality of discrete doped regions have the first conductivity type and a second net doping concentration that is higher than the first net doping concentration. The structure further includes a second voltage blocking layer having the first conductivity type and a third net doping concentration on the common contact layer and spaced apart from the first voltage blocking layer, a second blocking junction on the second voltage blocking layer, and a second plurality of discrete doped regions in the second voltage blocking layer and spaced apart from the second blocking junction. The second plurality of discrete doped regions have the first conductivity type and a fourth net doping concentration that is higher than the third net doping concentration. An ohmic contact is on the common contact layer.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Figure 1:
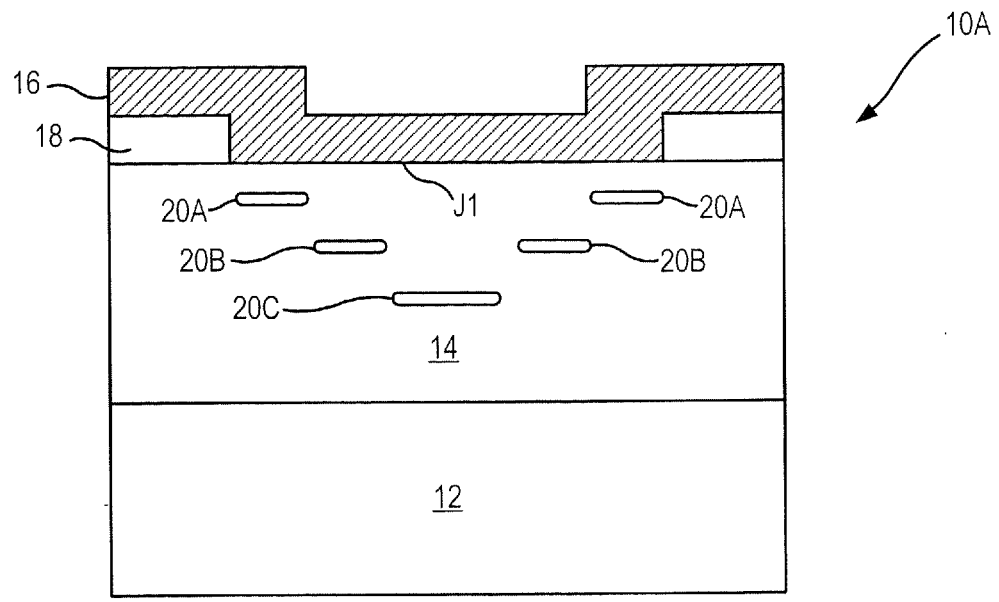
FIG. 1 is a cross-sectional view of a Schottky diode structure according to some embodiments of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below," "above," "upper," "lower," "horizontal," "lateral," "vertical," "over," "beneath," "on,"

etc., may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted regions. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

Referring to FIG. 1, a Schottky diode structure 10A according to some embodiments of the invention is illustrated. The diode 10A includes a contact layer 12 which can be highly doped and a voltage blocking layer 14, which can be lightly doped, on the contact layer 12. In some embodiments, the contact layer 12 and the voltage blocking layer 14 are n-type; however, the conductivity types of the various layers described herein could be reversed. In some embodiments, the contact layer 12 may have a net doping concentration of about $1\times10^{17}$ cm$^{-3}$ to about $5\times10^{19}$ cm$^{-3}$, while the voltage blocking 14 layer may have a net doping concentration of about $1\times10^{15}$ cm$^{-3}$ to about $2\times10^{18}$ cm$^{-3}$. In particular embodiments, the contact layer 12 may have a net doping concentration of about $5\times10^{18}$ cm$^{-3}$ to about $5\times10^{19}$ cm$^{-3}$, while the voltage blocking 14 layer may have a net doping concentration of about $2\times10^{16}$ cm$^{-3}$ to about $2\times10^{18}$ cm$^{-3}$. The thickness of the voltage blocking layer 14 may be selected to provide a desired blocking voltage level.

A metal anode contact 16 forms a Schottky junction J1 with the voltage blocking layer 14 in an active region defined by a field dielectric 18. The metal contact 16 may include a metal such as aluminum, titanium and/or nickel, which may form a Schottky junction with a silicon carbide layer. A cathode contact (not shown) is formed on the contact layer 12. An edge termination (not shown), such as a field plate, floating guard rings, and/or a junction termination extension can be formed around the junction to reduce field crowding at the periphery of the junction.

In some embodiments, the contact layer 12 comprises a bulk single crystal of a wide bandgap semiconductor, such as silicon carbide, diamond or a Group-III nitride material, such as gallium nitride, aluminum gallium nitride, etc. In the case of silicon carbide, the contact layer 12 may have a polytype selected from 3C, 4H, 6H, and 15R, and may have an orientation that is on-axis or slightly off-axis. In particular embodiments, the contact layer 12 includes 4H- or 6H silicon carbide having an off-axis orientation of up to 8° off-axis. As used herein, a "wide bandgap semiconductor" refers to a semiconductor material having a bandgap greater than about 2.5 eV, and includes at least silicon carbide and the Group-III nitrides.

Silicon carbide may be a particularly good semiconductor material for use in embodiments of the present invention. Silicon carbide (SiC) has been known for many years to have excellent physical and electronic properties which allow production of electronic devices that can operate at higher temperatures, higher power and/or higher frequency than devices produced from silicon (Si) or GaAs. The high electric breakdown field of above $2\times10^6$ V/cm, high saturated electron drift velocity of about $2\times10^7$ cm/sec and high thermal conductivity of about 4.9 W/cm-K indicate that SiC is suitable for high frequency, high power applications. In particular, the wide bandgap (about 3.0 eV for 6H—SiC) and high electric breakdown field of SiC makes SiC an excellent choice for high voltage devices. As used herein, "high frequency" refers to frequencies greater than about 30 MHz.

In particular, SiC-based devices are capable of blocking substantially greater voltages than comparable GaAs or Si devices for a given thickness of the voltage blocking, or drift, layer. Thus, for example, a SiC Schottky diode having a drift layer thickness of 2 μm is theoretically capable of sustaining a voltage greater than 400V without breakdown, while a similar device in silicon would require a drift layer thickness about 10 times as large. A varactor diode 10A according to some embodiments may have a voltage rating of about 50 to 200 V. Accordingly, in embodiments in which the drift layer 14 comprises silicon carbide, the drift layer 14 may have a thickness of less than 2 μm.

In some embodiments, the interface between the contact layer 12 and the voltage blocking layer 14 may include a heterojunction (i.e. a junction between dissimilar materials). For example, in some embodiments, the contact layer 12 may include a bulk single crystal of silicon carbide, and the voltage blocking layer 14 may include an epitaxial layer of a Group III-nitride, such as GaN. However, in some embodiments, the interface between the contact layer 12 and the voltage blocking layer 14 may include a homojunction (i.e. a junction between similar materials).

The varactor diode 10A further includes a plurality of discrete doped regions 20A-20C embedded in the voltage blocking layer 14. The discrete doped regions 20A-20C have the same conductivity type as the voltage blocking layer 14, but have different doping concentrations compared to the voltage blocking layer 14. In particular, the discrete doped regions 20A-20C may comprise delta-doped n+ regions in an n− voltage blocking layer 14. The discrete doped regions 20A-20C may have a net doping concentration in the range of about $1\times10^{16}$ cm$^{-3}$ to about $5\times10^{19}$ cm$^{-3}$. In particular embodiments, the discrete doped regions 20A-20C may have a net doping concentration in the range of about $1\times10^{18}$ cm$^{-3}$ to about $5\times10^{19}$ cm$^{-3}$. The doping concentrations of the discrete doped regions 20A-20C may be selected to provide a desired capacitance-voltage relationship when the diode 10A is reverse biased.

The discrete doped regions 20A-20C may not be interconnected with one another. In particular, there may be no interconnection between the discrete doped regions 20A at a first depth in the voltage blocking layer 14 and discrete doped regions 20B at a second depth in the voltage blocking layer 14, or between discrete doped regions 20B at the second depth in the voltage blocking layer 14 and discrete doped regions 20C at a third depth in the voltage blocking layer 14. In some embodiments, discrete doped regions 20A-20C at the same depth in the voltage blocking layer 14 may be connected together.

In some embodiments, the doping concentration of the discrete doped regions 20A-20C may vary with depth (i.e. distance from the junction J1). For example, in some embodiments, the doping concentration of the discrete doped regions 20A-20C may decrease with distance from the junction J1. In other embodiments, the doping concentration of the discrete doped regions 20A-20C may increase with distance from the junction J1. In still other embodiments, the doping concentration of the discrete doped regions 20A-20C may be about the same.

In some embodiments, similar implant doses may be used to form the discrete doped regions 20A-20C, so that the total charge of each of the regions may be about the same. However, because more deeply implanted dopants tend to spread out more (i.e. the straggle of the implant tends to increase with implant depth), the more deeply implanted dopants may be distributed with a lower concentration in terms of atoms/cm$^3$.

Using ion implantation techniques to form the discrete doped regions 20A-20C may permit placement of the discrete doped regions 20A-20C at any depth in the voltage blocking layer 14 tip to about 0.5 μm, based on the maximum implantation energy used and the species implanted. Although three different depths of discrete doped regions 20A-20C are illustrated in FIG. 1, it will be appreciated more or fewer levels of discrete doped regions 20A-20C can be provided. The number and/or positioning of the discrete doped regions 20A-20C may be selected to provide a desired capacitance-voltage relationship when the diode 10A is reverse biased.

The discrete doped regions 20A-20C can have a vertical thickness of from about 10 to 50 nm depending on the particular implant energy used. As used herein, "thickness" of the discrete doped regions 20A-20C refers to the vertical extent of a region of doped material in the voltage blocking layer 14 having a doping concentration in excess of $1 \times 10^{15}$ cm$^{-3}$.

In some embodiments, the total charge provided by the discrete doped regions 20A-20C can vary with depth in the voltage blocking layer 14. For example, the total charge provided by the discrete doped regions 20A-20C can decrease or increase with depth, depending on the desired capacitance-voltage relationship of the diode 10A. The total charge can be varied by varying the doping concentration in the discrete doped regions 20A-20C based on depth, and/or varying the number, size, and/or density of discrete doped regions 20A-20C in the voltage blocking layer 14 based on depth.

As the depletion region of the diode 10A expands outward from the junction J1 with increased reverse bias, the depletion region successively encloses the discrete doped regions 20A-20C, and the capacitance of the diode 10A changes accordingly. Thus, the capacitance-voltage relationship of the diode can be engineered by appropriate placement and doping of the discrete doped regions 20A-20C.

As illustrated in FIG. 1, the discrete doped regions 20A-20C may not overlap one another in a lateral direction (i.e. parallel to the junction J1) in some embodiments. In particular, manufacturing techniques using a single implant step may result in formation of discrete doped regions 20A-20C that do not overlap one another in a lateral direction. However, in some embodiments, the discrete doped regions 20A-20C may overlap one another in a lateral direction.

The presence of the discrete doped regions 20A-20C varies the capacitance-voltage relationship of the diode 10A. In particular, the depth, doping and/or layout of the discrete doped regions 20A-20C in the diode 10A can be selected to provide a desired capacitance-voltage relationship for the diode 10A. The diode structure 10A illustrated in FIG. 1 provides a plurality of parallel diode structures that have different effective capacitances with delta doped profiles at different depths. Accordingly, a varactor diode having a high dynamic range of capacitance can be formed by providing the discrete doped regions 20A-20C.

The discrete doped regions 20A-20C can be formed, for example, as delta doped regions in the voltage blocking layer 14 via selective implantation of ions. In particular, n-type ions, such as nitrogen and/or phosphorus, can be implanted into silicon carbide at implantation energies up to about 500 keV, corresponding to a maximum implant depth of up to about 0.5 μm. Although higher implant energies are possible, implantation at higher energies may result in unacceptably high levels of straddle, which can cause the discrete doped regions 20A-20C to spread out too much in a vertical direction.

Due to the high electric field strength of silicon carbide, the discrete doped regions 20A-20C can be formed entirely within the silicon carbide voltage blocking layer at depths at which they can affect the capacitance-voltage characteristics of the diode 10A under normal operating conditions.

Implantation of ions into silicon carbide is well known to those skilled in the art and is described, for example in U.S. Publication No. 2007/0292999, U.S. Pat. Nos. 5,851,908, and 6,107,142, which are assigned to the assignee of the present invention and the disclosures of which are incorporated herein by reference.

After implantation of dopants into the voltage blocking layer 14 to form the discrete doped regions 20A-20C, an activation anneal may be performed at a temperature in a range of about 1400° C. to about 1700° C. for between about 5 minutes and about 30 minutes.

For wide bandgap materials, the large field strength that can be supported means that the discrete doped regions 20A-20C can be placed throughout the voltage blocking layer 14 using ion implantation. In comparison, in the case of Si or GaAs based devices having comparable blocking voltages, the implantation depths achievable in such materials would only allow a fraction of the total thickness of the voltage blocking layer to be implanted. Since the voltage blocking layer thickness is comparable to that of the complex doped region, no excess thickness may be necessary to support voltage and add thereby add to the series resistance of the device.

Figure 2:
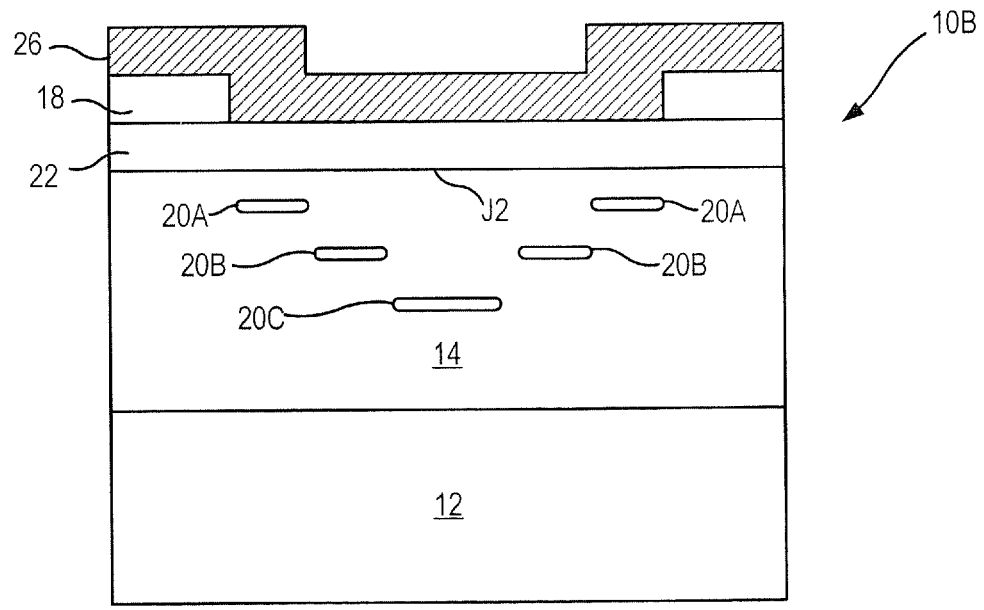
FIG. 2 is a cross-sectional view of a PIN diode structure according to some embodiments of the invention.

Referring to FIG. 2, a PIN diode structure 10B according to some embodiments is illustrated. Like numbers refer to like elements. In the PIN diode structure 10B, a highly doped layer 22 having an opposite conductivity type from the voltage blocking layer 14 is formed on the voltage blocking layer 14, and forms a P-N junction J2 with the voltage blocking layer. An ohmic contact 26 is formed on the doped layer 22. Modulation of the capacitance of the PIN diode structure 10B in response to a reverse bias is similar to that of the Schottky diode structure 10A of FIG. 1. In particular, a plurality of discrete doped regions 20A-20C are formed in the voltage blocking layer 14. As the depletion region of the diode 10B expands outward from the junction J2 with increased reverse bias, the depletion region successively encloses the discrete doped regions 20A-20C, and the capacitance of the diode 10B changes accordingly.

Figure 3:
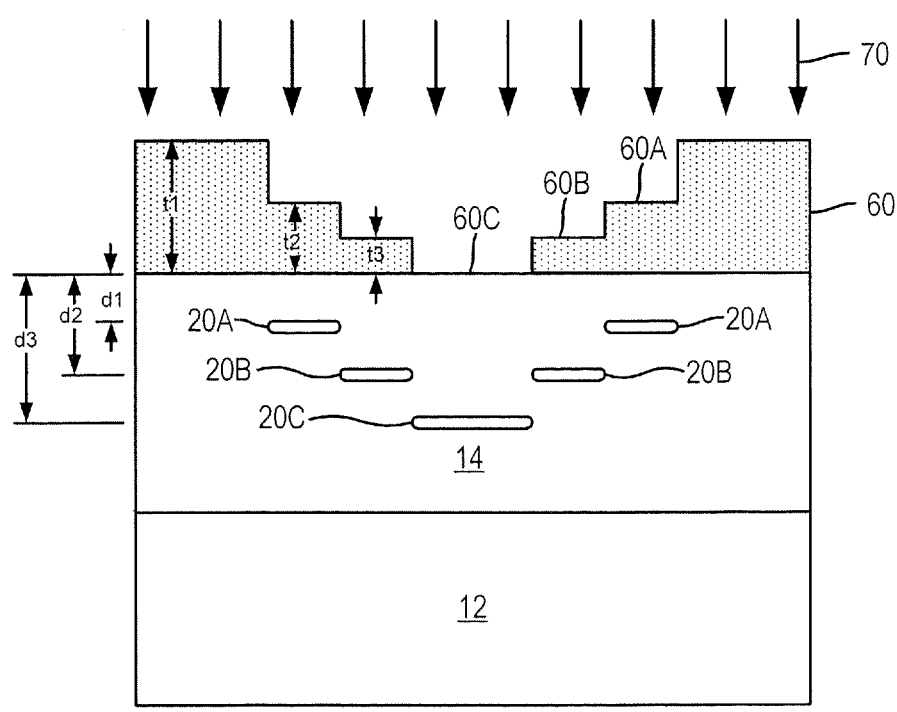
FIG. 3 is a cross-sectional view illustrating fabrication of a Schottky diode structure according to some embodiments of the invention.

FIG. 3 illustrates operations of forming varactor diodes according to some embodiments. As shown therein, a plurality of discrete doped regions 20A-20C can be formed in a voltage blocking layer 14 using a single implantation step. A multi-layered implant mask 60 is formed on a surface of the voltage blocking layer 14. The multi-layered implant mask 60 includes a plurality of first steps 60A having a first thickness and corresponding to the first discrete doped regions 20A (i.e. the shallowest regions), and a plurality of second steps 60B having a second thickness that is less than the first thickness and corresponding to the second discrete doped regions 20B. The multi-layered implant mask 60 further includes at least one opening 60C corresponding to the third discrete doped region 60C (the deepest region).

When ions 70 are implanted into the structure in a single implant step, the portions of the multi-layered implant mask 60 having a first thickness t1 block some ions completely. However, the ions implanted into the portions of the mask having a second thickness t2, less than t1, are permitted to penetrate to a first depth d1 in the voltage blocking layer 14 (corresponding to the first discrete doped regions 20A). Other ions implanted into the portions of the mask having a third thickness t3, less than t2, are permitted to penetrate to a second depth d2, which is greater than d1, in the voltage blocking layer 14 (corresponding to the second discrete doped regions 20B). Yet other ions pass through the opening 60C in the mask 60 and are permitted to penetrate to a third depth d3, which is greater than d2, in the voltage blocking layer 14 (corresponding to the third discrete doped regions 20C). In this manner, each of the discrete doped regions 20A-20C can be formed in a single implantation step, thereby potentially reducing manufacturing cost and/or time.

It will be appreciated that the discrete doped regions 20A-20C could be formed using separate mask and implant steps with different implant energies. The implant energies and doses are selected to provide a desired configuration of discrete doped regions 20A-20C in the voltage blocking layer 14.

Figure 4A:
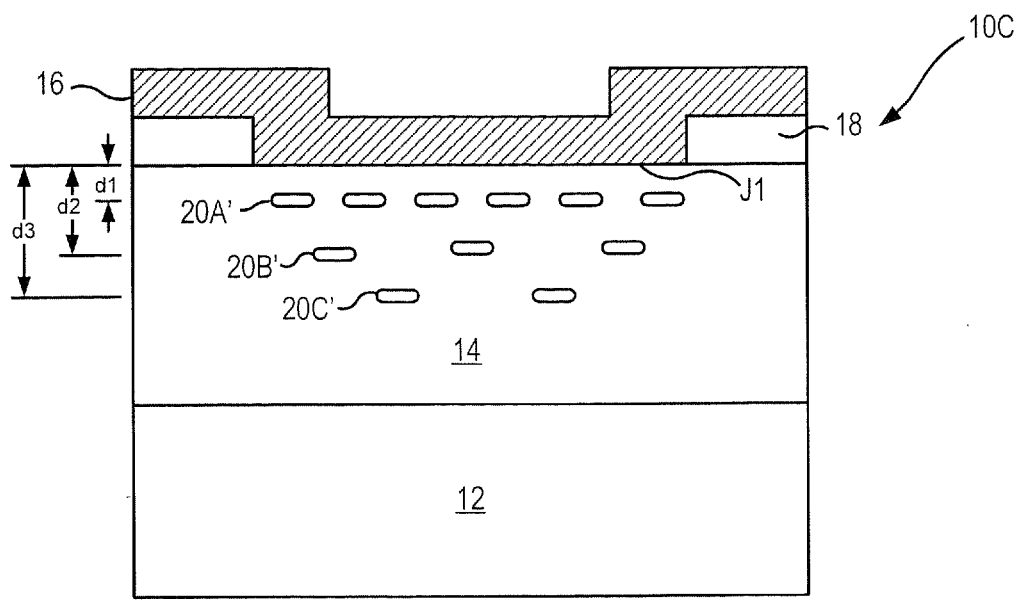
FIGS. 4A and 4B are cross-sectional views of Schottky diode structures according to further embodiments of the invention.
Figure 4B:
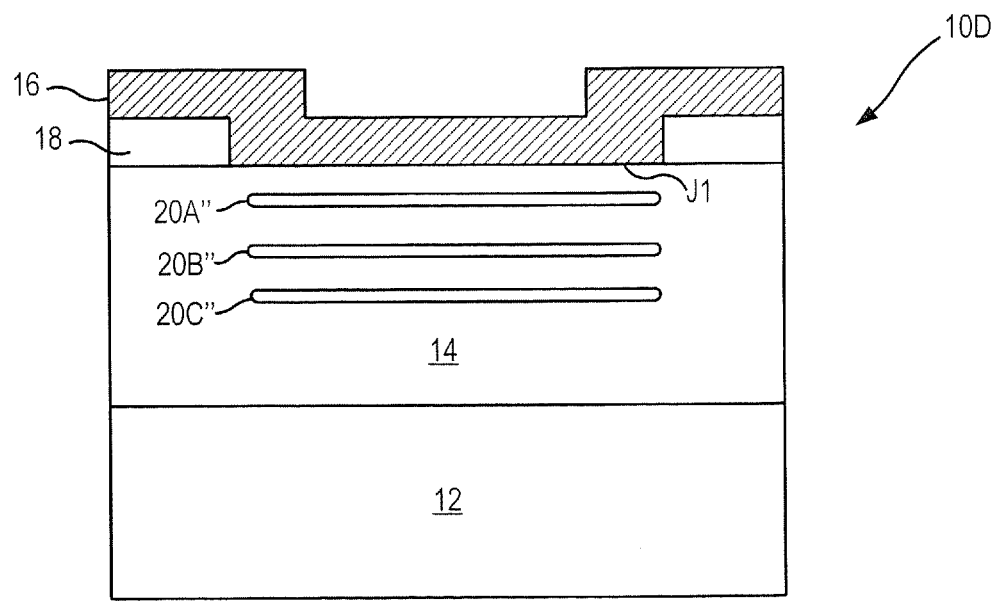

FIGS. 4A and 4B are cross-sectional views of Schottky diode structures 10C, 10D according to further embodiments of the invention. Referring to FIG. 4A, the discrete doped regions 20A'-20C' in the Schottky diode structure 10C can have a common size and doping level, but the density and/or number of discrete doped regions provided in the voltage blocking layer 14 can vary with distance from the junction J1. For example, the first discrete doped regions 20A' are provided at a first distance d1 from the junction, the second discrete doped regions 20B' are provided at a second distance d2 from the junction where d2>d1, and the third discrete doped regions 20C' are provided at a third distance d3 from the junction where d3>d2. Furthermore, the first discrete doped regions 20A' are provided at an areal density that is higher than an areal density of the second discrete doped regions 20B'. Likewise, the second discrete doped regions 20B' are provided at an areal density that is higher than an areal density of the third discrete doped regions 20C'.

Referring to FIG. 4B, the discrete doped regions 20A"-20C" in the Schottky diode structure 10D are provided at varying depths in the voltage blocking layer 14. In the diode structure 10D, however, the discrete doped regions 20A"-20C" overlap in the lateral direction. The doped regions 20A"-20C" may have net doping concentrations and/or thicknesses that vary with depth. For example, the net doping concentrations of the doped regions 20A"-20C" may decrease with distance from the junction J1.

Figure 5:
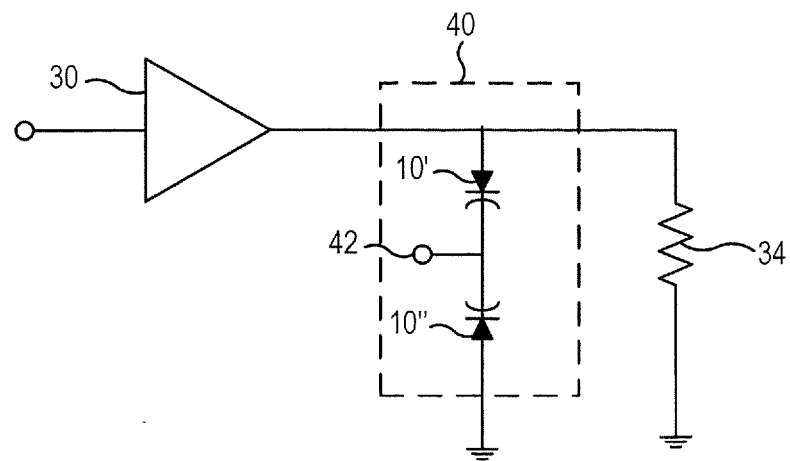
FIG. 5 is a circuit diagram of a high-frequency amplifier including a variable impedance matching circuit according to some embodiments of the invention.

FIG. 5 is a circuit diagram of a high-frequency amplifier circuit including an amplifier 30 that drives a high-frequency signal into a load 34. A variable impedance matching circuit 40 according to some embodiments of the invention is coupled between the amplifier 30 and the load 34, and adjusts the input impedance of the load 34 as seen by the amplifier 30. The variable impedance matching circuit 40 includes a pair of varactor diodes 10', 10" according to embodiments of the invention connected in an anti-series configuration with commonly connected cathodes. A control terminal 42 provides a reverse bias voltage to both of the varactor diodes 10', 10", and is used to modulate the capacitance of the diodes. It will be appreciated that the variable impedance matching circuit 40 can include other reactive elements configured to provide a desired impedance match. Furthermore, the varactor diodes can be provided in a different configuration, for example including further diodes in series so as to extend the capacitance tuning range. Accordingly, the circuit of FIG. 5 is provided as an exemplary implementation only.

Figure 6:
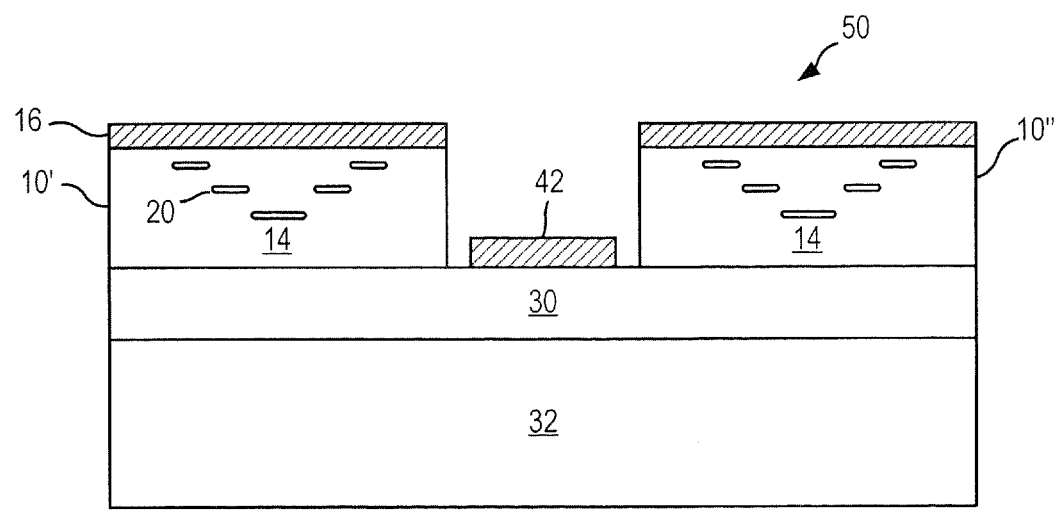
FIG. 6 a cross-sectional view of a structure according to some embodiments of the invention including a pair of Schottky diodes connected in an anti-series configuration.

FIG. 6 illustrates a structure 50 including a pair of varactor diodes 10', 10" according to further embodiments of the invention. The varactor diodes 10', 10" include respective voltage blocking layers 14 on a common contact layer 30, and Schottky contacts 16 on the voltage blocking layers 14. However, it will be appreciated that one or more of the diodes 10', 10" could include a PIN diode structure. The common contact layer 30 is supported by a semi-insulating substrate 32, which may include semi-insulating silicon carbide. Other insulating or semi-insulating materials may be used for the substrate 32, such as AlN, alumina, sapphire, etc.

The common contact layer 30 may have the same conductivity type as the voltage blocking layers 14, and will have a higher doping concentration than the voltage blocking layers 14. In some embodiments, the common contact layer 30 may include a bulk single crystal of silicon carbide or another wide bandgap semiconductor, and the voltage blocking layers 14 may include epitaxial layers of silicon carbide or another wide bandgap semiconductor. In some embodiments, the common contact layer 30 may include a bulk single crystal of silicon carbide, and the voltage blocking layers 14 may include epitaxial layers of a Group III-nitride, such as GaN, so that the interfaces between the common contact layer 30 and the voltage blocking layers 14 may form heterojunctions. However, in some embodiments, the common contact layer 30 and the voltage blocking layers 14 may form homojunction interfaces.

As the diodes 10', 10" share the common contact layer 12, the diodes 10', 10" are connected in an anti-series configuration. Accordingly, an ohmic contact 42 on the common contact layer 30 can be used to provide a bias voltage for both diodes 10', 10".

A plurality of discrete doped regions 20 are formed in the respective voltage blocking layers 14 in the manner described above to provide the diodes 10', 10" with appropriate capacitance modulation characteristics. The discrete doped regions in the diodes 10', 10" may be formed to have the same or different capacitance modulation characteristics.

Although embodiments of the invention have been described as being intended for use in high efficiency RF power amplifiers, varactor diodes according to some embodiments can be used in other applications in which a voltage controlled impedance is used, such as voltage controlled oscillators (VCOs), tunable filters, phase shifters, active antennas, etc.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A varactor diode, comprising:
    a contact layer having a first conductivity type;
    a voltage blocking layer on the contact layer, the voltage blocking layer having the first conductivity type and a first net doping concentration;
    a blocking junction on the voltage blocking layer; and
    a plurality of discrete doped regions embedded within and completely surrounded by the voltage blocking layer and spaced apart from the blocking junction,
    wherein the plurality of discrete doped regions have the first conductivity type and a second net doping concentration that is higher than the first net doping concentration and
    wherein the discrete doped regions are spaced apart from one another within the voltage blocking layer in a vertical direction relative to the blocking junction.

2. The varactor diode of claim 1, wherein the plurality of discrete doped regions comprises first discrete doped regions spaced a first distance from the blocking junction and wherein the varactor diode further comprises second discrete doped regions spaced a second distance from the blocking junction, wherein the second distance is greater than the first distance.

3. The varactor diode of claim 2, wherein the first distance is between about 0.1 and 0.2 μm and wherein the second distance is between about 0.2 and 0.3 μm.

4. The varactor diode of claim 2, wherein the first discrete doped regions provide a first total charge at the first distance from the blocking junction and the second discrete doped regions provide a second total charge at the second distance from the blocking junction, wherein the second total charge is greater than the first total charge.

5. The varactor diode of claim 2, wherein the second discrete doped regions have a third net doping concentration, wherein the third net doping concentration is less than the second net doping concentration.

6. The varactor diode of claim 5, wherein the plurality of discrete doped regions further comprises third discrete doped regions spaced a third distance from the blocking junction, wherein the third distance is greater than the second distance, and wherein the third discrete doped regions have a fourth net doping concentration, wherein the fourth net doping concentration is less than the third net doping concentration.

7. The varactor diode of claim 2, wherein the plurality of discrete doped regions further comprises third discrete doped regions spaced a third distance from the blocking junction, wherein the third distance is greater than the second distance.

8. The varactor diode of claim 7, wherein the third distance is between about 0.3 and 0.4 μm.

9. The varactor diode of claim 7, wherein the first, second and third discrete doped regions do not overlap in a lateral direction parallel to the blocking junction.

10. The varactor diode of claim 7, wherein the thickness of the voltage blocking layer is not greater than twice a maximum depth of the discrete_doped regions.

11. The varactor diode of claim 1, further comprising a Schottky metal contact on the voltage blocking layer, wherein the blocking junction comprises a Schottky barrier junction.

12. The varactor diode of claim 1, further comprising a second layer having a second conductivity type opposite the first conductivity type on the voltage blocking layer, wherein the blocking junction comprises a P-N junction between the second layer and the voltage blocking layer.

13. The varactor diode of claim 1, wherein the voltage blocking layer comprises silicon carbide.

14. A variable impedance matching circuit for a high frequency amplifier comprising two varactor diodes, as recited in claim 1, connected in an anti-series configuration with commonly connected cathodes coupled to a control terminal.

15. The varactor diode of claim 1, wherein the plurality of discrete doped regions are configured to modulate the capacitance of the varactor diode as a depletion region of the varactor diode expands in response to a reverse bias voltage applied to the blocking junction.

* * * * *